(12) United States Patent
Yan et al.

(10) Patent No.: US 9,805,914 B2
(45) Date of Patent: Oct. 31, 2017

(54) METHODS FOR REMOVING CONTAMINATION FROM SURFACES IN SUBSTRATE PROCESSING SYSTEMS

(71) Applicant: APPLIED MATERIALS, INC., Santa Clara, CA (US)

(72) Inventors: Chun Yan, San Jose, CA (US); Jim Zhongyi He, San Jose, CA (US); Xinyu Bao, Mountain View, CA (US); Teng-Fang Kuo, Santa Clara, CA (US); Zhenwen Ding, Santa Clara, CA (US); Adam Lane, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 65 days.

(21) Appl. No.: 14/698,556

(22) Filed: Apr. 28, 2015

(65) Prior Publication Data

US 2016/0293384 A1 Oct. 6, 2016

Related U.S. Application Data

(60) Provisional application No. 62/142,775, filed on Apr. 3, 2015.

(51) Int. Cl.
*B08B 6/00* (2006.01)
*C25F 1/00* (2006.01)
*H01J 37/32* (2006.01)
*H01L 21/02* (2006.01)

(52) U.S. Cl.
CPC .. *H01J 37/32082* (2013.01); *H01J 37/32862* (2013.01); *H01L 21/02068* (2013.01)

(58) Field of Classification Search
CPC .......... H01J 37/32862; H01J 2237/022; H01L 21/02041; H01L 21/3065; H01L 21/02057
USPC ............... 134/1.3, 22.18, 26, 30, 34, 36, 37; 438/905; 216/67; 156/916, 281
See application file for complete search history.

(56) References Cited

U.S. PATENT DOCUMENTS

| | | | | |
|---|---|---|---|---|
| 5,275,687 | A * | 1/1994 | Choquette | ............... C30B 29/42 117/953 |
| 7,014,788 | B1 * | 3/2006 | Fujimura | ................. C23G 5/00 134/1.1 |
| 8,338,308 | B2 * | 12/2012 | Qiu | ................... H01J 37/32082 216/37 |
| 2006/0207968 | A1 * | 9/2006 | Mumbauer | ......... B81C 1/00595 216/58 |

(Continued)

*Primary Examiner* — Nadine Norton
*Assistant Examiner* — Christopher Remavege
(74) *Attorney, Agent, or Firm* — Moser Taboada; Alan Taboada

(57) ABSTRACT

Methods for removing contamination from a surface disposed in a substrate processing system are provided herein. In some embodiments, a method for removing contaminants from a surface includes: providing a first process gas comprising a chlorine containing gas, a hydrogen containing gas, and an inert gas to a process chamber having the surface disposed within the process chamber; igniting the first process gas to form a plasma from the first process gas; and exposing the surface to the plasma to remove contaminants from the surface. In some embodiments, the surface is an exposed surface of a process chamber component. In some embodiments, the surface is a surface of a first layer disposed atop a substrate, such as a semiconductor wafer.

8 Claims, 5 Drawing Sheets

(56) References Cited

U.S. PATENT DOCUMENTS

| | | | | |
|---|---|---|---|---|
| 2007/0186953 A1* | 8/2007 | Savas | ............... | G03F 7/427 |
| | | | | 134/1.3 |
| 2009/0139540 A1* | 6/2009 | Lau | ............... | B08B 7/0035 |
| | | | | 134/1.1 |
| 2015/0093862 A1* | 4/2015 | Nainani | ............ | H01L 21/02063 |
| | | | | 438/197 |

* cited by examiner

METHODS FOR REMOVING CONTAMINATION FROM SURFACES IN SUBSTRATE PROCESSING SYSTEMS

FIELD

Embodiments of the present disclosure generally relate to methods of removing contamination from surfaces, such as substrates or chamber surfaces, in semiconductor processing systems.

BACKGROUND

In semiconductor substrate processing systems, process chamber components, such as a substrate support, may be coated with material, such as yttrium oxide, which can contain metal impurities, for example nickel, iron, titanium or the like. As chamber components are exposed to a plasma process within the process chamber, the metal impurities can diffuse out of the chamber components. Additional metal impurities can also be introduced into the process chamber from external sources, such as through process chamber gas lines.

Group III-V materials may be advantageous in certain applications for silicon-based devices, for example, in the channel of a transistor device. For example, Group III-V materials may be used to provide mobility enhancement for complementary metal-oxide-semiconductor (CMOS) channels. Unfortunately, the inventors have observed that processes for deposition of Group III-V materials on silicon (Si) substrates often results in poor material quality as a result of contaminants, for example an oxide layer, that can form atop the Group III-V materials.

Accordingly, the inventors have developed improved methods of removing contamination from the surface of a semiconductor substrate or from the surface of semiconductor processing chamber component.

SUMMARY

Methods for removing contamination from a surface disposed in a substrate processing system are provided herein. In some embodiments, a method for removing contaminants from a surface includes: providing a first process gas comprising a chlorine containing gas, a hydrogen containing gas, and an inert gas to a process chamber having the surface disposed within the process chamber; igniting the first process gas to form a plasma from the first process gas; and exposing the surface to the plasma to remove contaminants from the surface.

In some embodiments, methods for removing contaminants from a surface of a process chamber component include: providing a first process gas to a process chamber comprising a chlorine containing gas, a hydrogen containing gas, and an inert gas, wherein the flow rate of the chlorine containing gas is about 100 sccm to about 300 sccm, and wherein the flow rate of the hydrogen containing gas is about 30 sccm to about 300 sccm, and wherein the flow rate of the inert gas is about 100 sccm to about 500 sccm; forming a plasma from the first process gas using an RF power source providing about 500 watts to about 2000 watts of power at a frequency of about 13.56 MHz; and exposing the surface of the process chamber component to the plasma to remove metal-containing contaminants from the surface.

In some embodiments, methods for removing contaminants from a surface of a first layer disposed atop a substrate include: providing a first process gas to a process chamber comprising a chlorine containing gas, a hydrogen containing gas, and an inert gas; forming a plasma from the first process gas using an RF power source providing about 150 watts to about 300 watts of power at a frequency of about 13.56 MHz; exposing the surface of the first layer disposed atop the substrate to the plasma; applying a bias power to the substrate while exposing the surface of the first layer to the plasma, wherein the bias power is provided from an RF power source providing about 10 watts to about 50 watts of power; exposing the surface of the first layer to a second process gas comprising hydrogen ($H_2$) and tert-butyl-alcohol (TBA) at a temperature of about 600 degrees Celsius to about 650 degrees Celsius; and exposing the surface of the first layer to a process gas comprising a Group III element and a Group V element to deposit a layer atop the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

DETAILED DESCRIPTION

Methods for removing contamination from surfaces in a substrate processing system are provided herein. Specifically, in some embodiments, contaminants may be removed from surfaces of process chamber components. In some embodiments, contaminants may be removed from surfaces of a Group III-V material layer disposed atop a substrate, such as a semiconductor wafer. The inventive methods described herein advantageously facilitate removal of contaminants from process chamber components, for example a substrate support. In some embodiments, the inventive methods described herein advantageously facilitate removal of contaminants from a surface of a Group III-V material layer disposed atop a substrate. For example, without limitation, the inventive methods may be utilized in the formation of CMOS devices having 10 nm or smaller channels, such as 7 nm or 5 nm.

Figure 1:
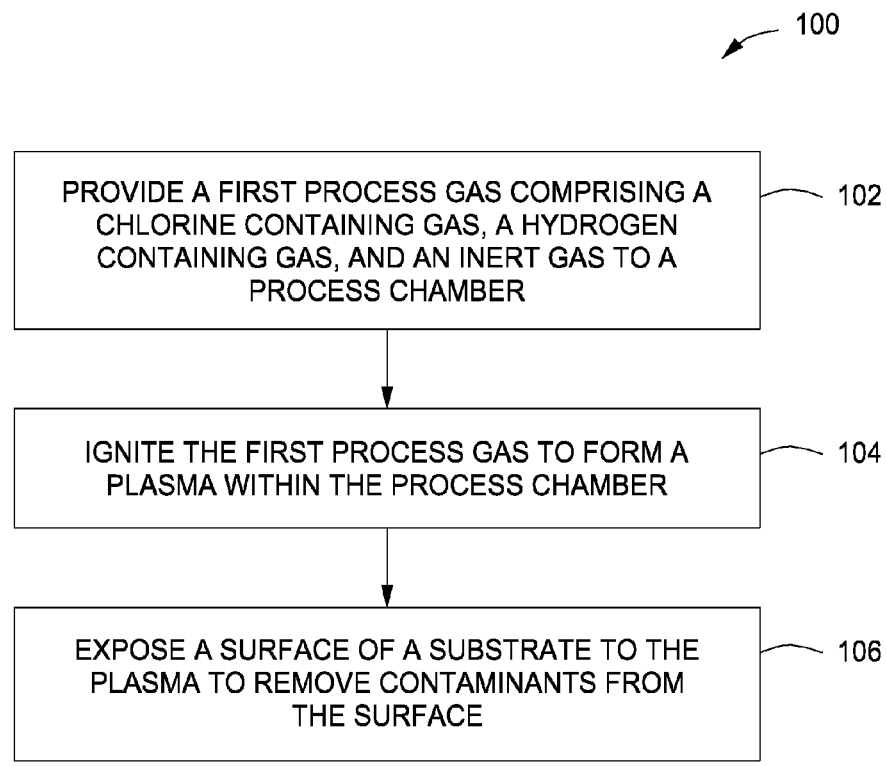
FIG. 1 depicts a flow chart of a method for removing contaminants from a substrate in accordance with some embodiments of the present disclosure.

FIG. 1 depicts a flow chart of a method 100 for removing contamination from a surface in accordance with some embodiments of the present disclosure. The method 100 begins at 102 by providing a first process gas comprising a chlorine containing gas, a hydrogen containing gas, and an inert gas to a process chamber. In some embodiments, the process chamber may be a process chamber suitable for performing a plasma process, for example a physical vapor deposition chamber or a chemical vapor deposition chamber, such as described with respect to FIG. 4. At 104, the first process gas is ignited to form a plasma within the process chamber. Alternatively, the first process gas may be ignited to form a plasma outside of the process chamber (e.g., remotely) and the plasma may be directed into the process chamber. At 106, a surface disposed within the process chamber is exposed to the plasma to remove contaminants from the surface.

In some embodiments, the surface is an exposed surface of a process chamber component. For example, in some embodiments, the process chamber component is a substrate support, a chamber liner, a chamber lid, or the like. In some embodiments, the inventors have observed that chamber components, such as a substrate support, may be coated with material, such as yttrium oxide, which can contain metal impurities, for example nickel, iron, titanium or the like. In other embodiments, metal impurities can include calcium, potassium, and sodium, which can result from process kit handling, or iron, chromium, and nickel, which can introduced through chamber gas lines, or magnesium, zinc, titanium, copper, or combinations thereof. As chamber components are exposed to a plasma process within the process chamber, the metal impurities can diffuse out of the chamber components and result in metal contamination during processing runs. Additional metal impurities can also be introduced into the process chamber from external sources, such as through process chamber gas lines. In some embodiments, the metal contaminants react easily with oxygen in the process chamber to form metal oxide contamination.

Figure 2:
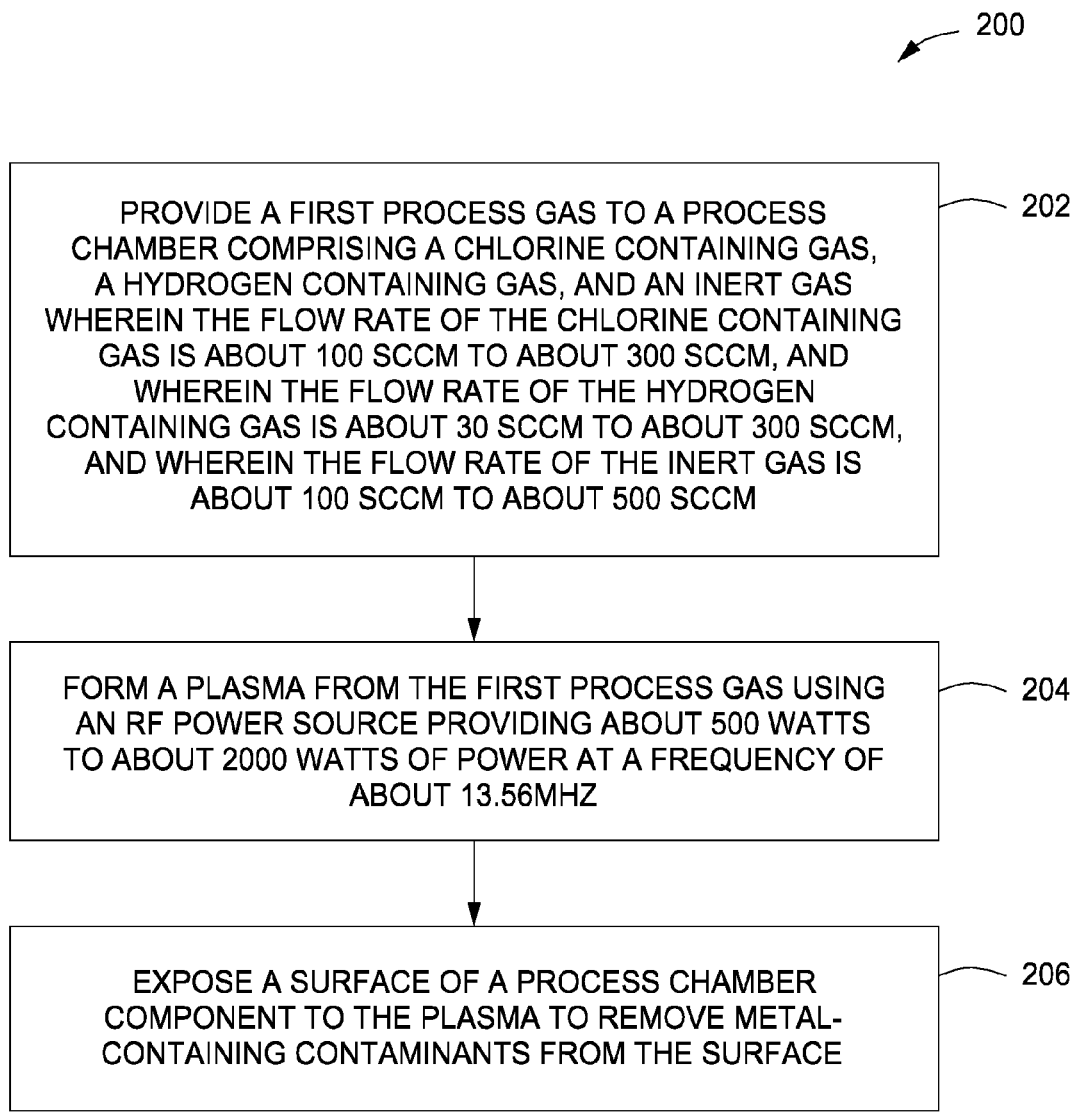
FIG. 2 depicts a flow chart of a method for removing contaminants from a surface of a process chamber component in accordance with some embodiments of the present disclosure.

FIG. 2 depicts a flow chart of a method 200 for removing contamination from a surface of a process chamber component in accordance with some embodiments of the present disclosure. The method 200 is suitable for any process chamber in which a plasma can be formed, for example, in a physical vapor deposition chamber or a chemical vapor deposition chamber, such as described in FIG. 4 below. The method 200 begins at 202 by providing a first process gas to a process chamber. The first process gas comprises a chlorine containing gas, hydrogen containing gas, and an inert gas. In some embodiments, the chlorine containing gas may be any chlorine containing gas suitable for performing an etching process. For example, in some embodiments, the chlorine containing gas can be one of chlorine ($Cl_2$) gas, hydrogen chloride (HCl), boron chloride ($BCl_3$), carbon tetrachloride ($CCl_4$), or the like. In some embodiments, the flow rate of the chlorine containing gas is about 100 sccm to about 300 sccm. In some embodiments, the hydrogen containing gas may be any suitable gas that produces hydrogen radicals to react with the oxide in a metal oxide contaminant. For example, the hydrogen containing gas may be one of hydrogen gas ($H_2$), ammonia ($NH_3$), methane ($CH_4$), or the like. In some embodiments, the flow rate of the hydrogen containing gas is about 30 sccm to about 300 sccm. In some embodiments, the inert gas is any suitable inert gas, such as argon, helium, or xenon, for striking plasma in the process chamber. In some embodiments, the flow rate of the inert gas is about 100 sccm to about 500 sccm. The method 200 is performed at suitable process chamber parameters such as at a pressure of about 5 mTorr to about 50 mTorr and a temperature of about 30 degrees Celsius to about 80 degrees Celsius.

Next, at 204, a plasma is formed from the first process gas using an RF power source. In some embodiments, the RF power source may provide any suitable amount of power to ignite the process gas. For example, in some embodiments, the RF power source provides about 500 watts to about 2000 watts of power at a frequency of about 13.56 MHz. At 206, the surface of the process chamber component is exposed to the plasma to remove metal-containing contaminants from the surface. For example, in some embodiments, hydrogen radicals from the hydrogen containing gas react with the metal oxide to form metal and water vapor, while the chlorine acts to etch the metal contaminants, which can then be evacuated from the process chamber.

Figure 3:
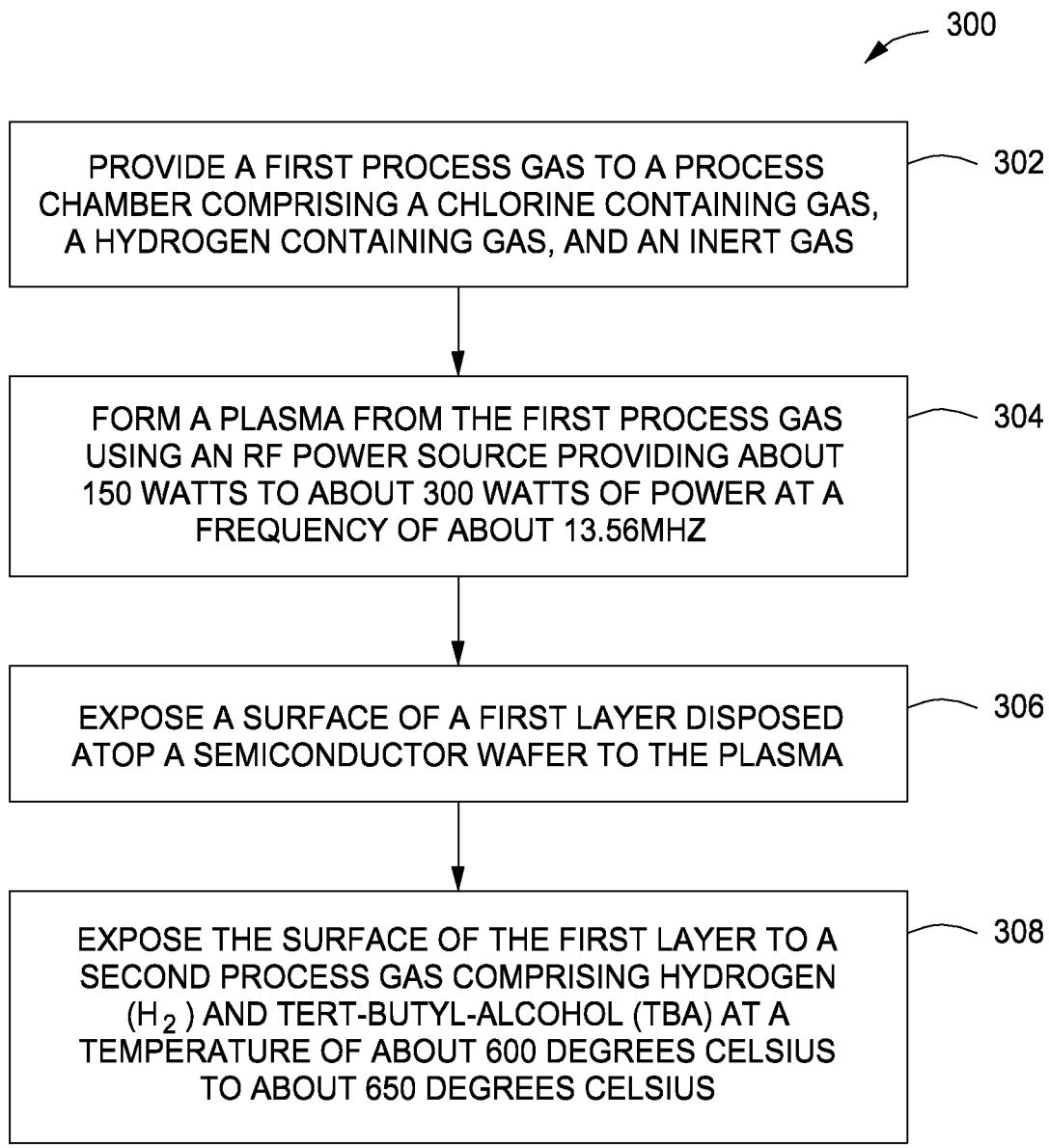
FIG. 3 depicts a flow chart of a method for removing contaminants from a surface of a first layer disposed atop a substrate in accordance with some embodiments of the present disclosure.
Figure 5A:
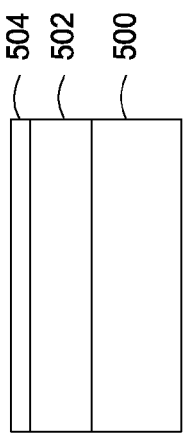
FIG. 5A-5C depicts side cross-sectional views of the stages of removing contaminants from a surface of a first layer disposed atop a substrate in accordance with some embodiments of the present disclosure.
Figure 5B:
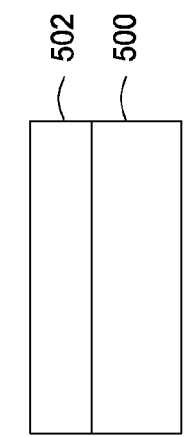
Figure 5C:
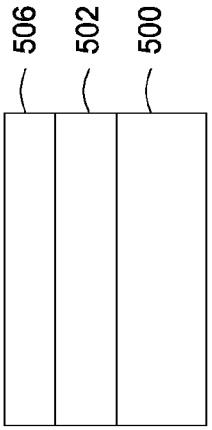

In some embodiments, the substrate is an exposed surface of a first layer disposed atop a substrate, such as a semiconductor wafer. FIG. 3 depicts a flow chart of a method 300 for removing contamination from an exposed surface of a first layer disposed atop a substrate in accordance with some embodiments of the present disclosure. The method 300 is described with respect to side cross-sectional views of the stages of removing contaminants from a surface of a first layer disposed atop a substrate in accordance with some embodiments of the present disclosure, as depicted in FIGS. 5A-5C. The method 300 is performed on a substrate (semiconductor wafer 500) having a first layer 502 disposed on the semiconductor wafer 500, as depicted in FIG. 5A. In some embodiments, the semiconductor wafer comprises a doped or un-doped silicon substrate.

In some embodiments, the first layer 502 comprises a Group III-V compound material, such as indium phosphate (InP), indium arsenide (InAs), gallium arsenide (GaAs), indium gallium arsenide (InGaAs), or the like. In some embodiments, Group III-V compound materials may be advantageous in certain applications for silicon-based devices, for example, as materials in the channel of a transistor device. For example, Group III-V materials may be used to provide mobility enhancement in complementary metal-oxide-semiconductor (CMOS) channels. Unfortunately, the inventors have observed that processes for deposition of Group III-V compound materials on silicon (Si) substrates often results in poor material quality as a result of contaminants that can form atop the Group III-V compound materials. For example, in some embodiments a contaminant layer 504 may comprise an oxide layer, such as gallium oxide (GaO), arsenic oxide (AsO), or the like. The first layer 502 may be deposited via any suitable deposition process, such as a chemical vapor deposition process or atomic layer deposition process.

The method 300 begins at 302 by providing a first process gas to a process chamber having a substrate (such as semiconductor wafer 500) disposed within the process chamber. In some embodiments, the first process gas comprises a chlorine containing gas, a hydrogen containing gas, and an inert gas.

In some embodiments, the chlorine containing gas can be one of chlorine ($Cl_2$) gas, hydrogen chloride (HCl), or the like. In some embodiments, the flow rate of the chlorine containing gas is about 10 sccm to about 20 sccm. In some embodiments, the hydrogen containing gas may be one of hydrogen gas ($H_2$), ammonia ($NH_3$), methane ($CH_4$), or the like. In some embodiments, the flow rate of the hydrogen containing gas is less than about 100 sccm. In some embodiments, the inert gas is any suitable inert gas, such as argon, helium, or xenon, for striking plasma in the process chamber. In some embodiments, the flow rate of the inert gas is about 500 sccm to about 1200 sccm.

In some embodiments, the first process gas comprises a chlorine containing gas and an inert gas. In some embodiments, the chlorine containing gas and the inert gas may be any suitable chlorine containing gas and inert gas as described above. In such embodiments, the flow rate of the chlorine containing gas is less than about 100 sccm. In such embodiments, the flow rate of the inert gas is about 500 sccm to about 1200 sccm. The method 300 is performed at suitable process chamber parameters such as at a pressure of about 10 mTorr to about 30 mTorr and a temperature of about 30 degrees Celsius to about 50 degrees Celsius.

Next, at 304, a plasma is formed from the first process gas using an RF power source. In some embodiments, the RF power source may provide any suitable amount of power to ignite the process gas. For example, in some embodiments, the RF power source provides about 150 watts to about 300 watts of power at a frequency of about 13.56 MHz. The inventors have observed that low RF power, for example about 150 watts to about 300 watts, advantageously removes the contaminant layer 504 without damaging (or with minimal damage to) the underlying first layer 502. In some embodiments, the plasma formed has an ion energy of less than about 50 eV. In some embodiments, a bias power is applied to the substrate to accelerate ions from the plasma toward the surface of the substrate. In some embodiments, the bias power is less than about 30 watts.

At 306, the surface of the substrate is exposed to the plasma to remove the contaminant layer 504 from the surface of the first layer 502. In some embodiments, the substrate is exposed to the plasma for about 5 to about 30 seconds. Without wishing to be bound by theory, the inventors have observed that exposing the substrate to the plasma acts to break metal oxide bonds at the surface of the substrate and form a chlorinated hydrogenated layer at the contaminant layer 504. This layer is subsequently removed at 308 described below. For example, in embodiments where the first layer 502 is a gallium-arsenide (GaAs) layer, the contaminant layer 504 comprises gallium oxide (GaO) and arsenic oxide (AsO). Ions from the low energy plasma break the gallium oxide (GaO) and arsenic oxide (AsO) bonds, leaving dangling bonds at the surface of the substrate. Hydrogen radicals from the plasma react with the metal oxide to form water vapor, while the chlorine acts to etch the metal contaminants, which can be evacuated from the process chamber. 302-306 may be performed in a suitable process chamber in which a plasma can be formed, for example, in a chemical vapor deposition chamber, such as described in FIG. 4 below.

Next, at 308, the substrate is exposed to a second process gas comprising hydrogen ($H_2$) and tert-butyl-alcohol (TBA) at a temperature of less than about 650 degrees Celsius, for example about 600 degrees Celsius to about 650 degrees Celsius, to remove residual oxygen from the surface of the first layer 502. In some embodiments, wherein the first layer 502 comprises gallium arsenide (GaAs), the inventors have observed that an anneal process at less than about 650 degrees Celsius advantageously prevents diffusion of arsenic and prevents pitting on the surface of the first layer 502. In some embodiments, the substrate is exposed to the second process gas for about 60 seconds. In some embodiments, the substrate is exposed to the second process gas at a pressure of about 10 to about 80 Torr. Following 308, the surface of the first layer 502 is free, or substantially free of the contaminant layer 504 as depicted in FIG. 5B. In some embodiments, 308 may be performed in a commercially available process chamber, such as the RP EPI® chamber, available from Applied Materials, Inc. of Santa Clara, Calif., or any other suitable semiconductor process chamber adapted for performing an epitaxial deposition processes.

After the contaminant layer 504 has been evaporated from the surface of the first layer 502, a layer 506 comprising a Group III-V material can be deposited onto the first layer 502, as depicted in FIG. 5C. In some embodiments, layer 506 may be the same material as layer 502. In some embodiments, layer 506 may comprise materials that are not the same as layer 502. 302-310 can be repeated until a predetermined amount or thickness of layer 506 is formed.

Figure 6A:
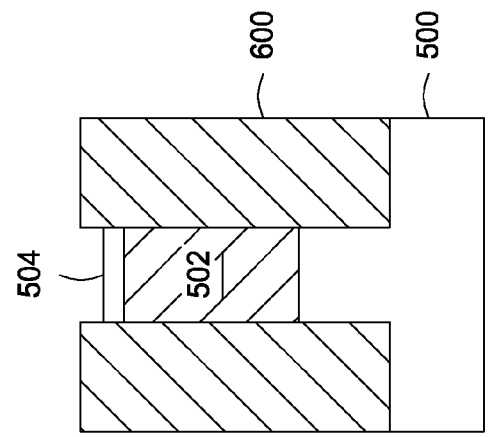
FIG. 6A-6C depicts side cross-sectional views of the stages of removing contaminants from a surface of a first layer disposed atop a substrate in accordance with some embodiments of the present disclosure To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.
Figure 6B:
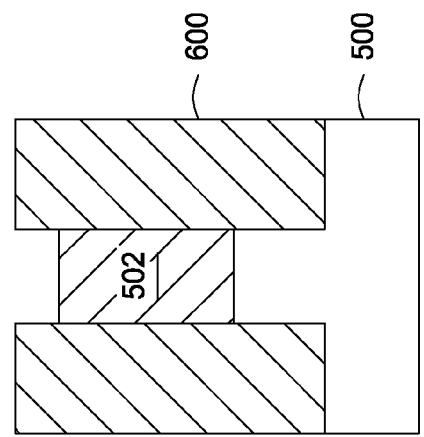
Figure 6C:
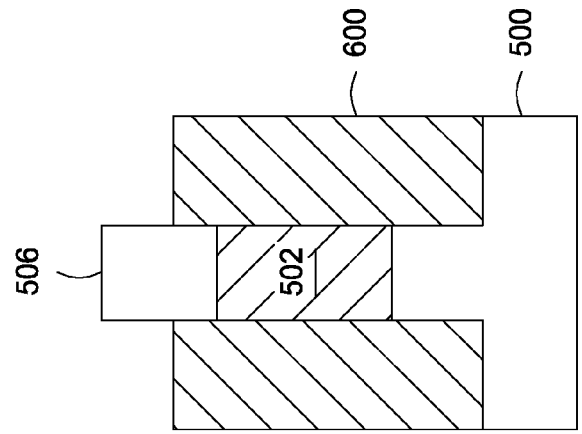

In some embodiments, as depicted in FIGS. 6A-6C, the substrate (e.g., semiconductor wafer 500) may comprise one or more layers 600 suitable for semiconductor fabrication, for example, oxide layers, nitride layers, high or low K dielectric layers, conductive layers, or the like. The layers 600 may be formed via any suitable process, for example, such as physical vapor deposition, chemical vapor deposition, epitaxial growth, or the like. Alternatively or in combination, in some embodiments, one or more features (e.g., a via, a trench, a dual damascene structure, or the like) may be formed in the substrate (e.g., semiconductor wafer 500) and/or one or more layers 600 formed on the substrate (e.g., semiconductor wafer 500). The features may be formed via any suitable process, for example such as an etch process. In some embodiments, and as depicted in FIG. 6A, the feature may be partially filled with a first layer 502, as described above, having a contaminant layer 504 formed on the surface of the first layer 502. As described above, the substrate may be subjected to the method 300 to remove or substantially remove the contaminant layer 504 as depicted in FIG. 6B. After the contaminant layer 504 has been evaporated from the surface of the first layer 502, a layer 506 comprising a Group III-V compound material as described above can be deposited onto the first layer 502 within the feature, as depicted in FIG. 6C. In some embodiments, the layer 506 may be formed using any suitable deposition process. The inventors have observed that the method 300 as described herein advantageously removes a contaminant layer 504 from inside narrow features, for example 10 nm or smaller channels, such as 7 nm or 5 nm. The inventive methods are suitable for use to remove contaminant layers in substrates having other feature sizes as well.

Figure 4:
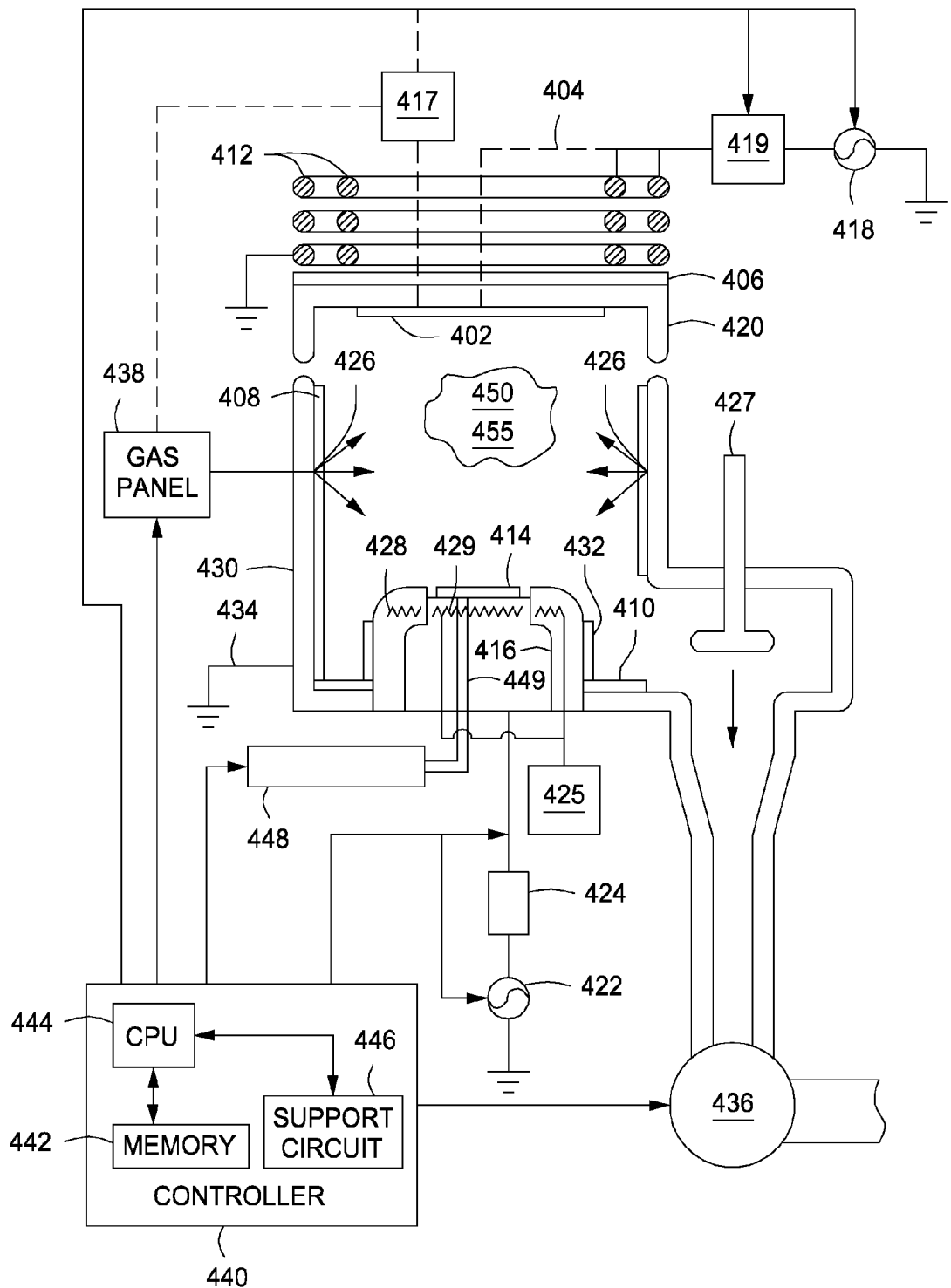
FIG. 4 depicts a process chamber suitable for performing a method of etching a substrate in accordance with some embodiments of the present disclosure.

FIG. 4 depicts a schematic diagram of an inductively coupled plasma process chamber in accordance with embodiments of the present disclosure. The process chamber 400 may be utilized alone or, as a processing module of an integrated semiconductor substrate processing system, or cluster tool, such as a CENTURA® integrated substrate processing system, available from Applied Materials, Inc. of Santa Clara, Calif. Examples of suitable plasma reactors suitable for the methods described herein include inductively coupled plasma etch reactors such as the DPS® line of semiconductor equipment or other inductively coupled plasma reactors, such as MESA™ or the like also available from Applied Materials, Inc. The above listing of semiconductor equipment is illustrative only, and other etch reactors, may also be suitably utilized in accordance with the present teachings.

The process chamber 400 includes a substrate support 416 (cathode) within a conductive body (wall 430), and a controller 440. Optionally, one or more liners may be provided to line the walls, floor, and/or ceiling of the process chamber 400. As depicted in FIG. 4, a liner 408 is shown along the side wall of the process chamber 400, along with a liner 410 along the floor, and a liner 432 along the sides of the substrate support 416.

The process chamber 400 may be supplied with a substantially flat ceiling 420. Alternatively, the process chamber 400 may have other types of ceilings, e.g., a dome-shaped ceiling. In some embodiments, a heat source 406 may be disposed in or adjacent to the ceiling 420. The heat source may comprise one or more of resistive heaters, infrared lamps or other sources of infrared heat energy, a fluid heat transfer medium provided to heat transfer fluid flow channels formed in or adjacent to the ceiling 420.

In embodiments where an inductively coupled direct plasma is to be formed, the ceiling 420 may be dielectric. In such embodiments, an antenna comprising at least one inductive coil element 412 is disposed above the ceiling 420 (two co-axial inductive coil elements 412 are shown). The inductive coil element 412 is coupled to a plasma power source 418 through a first matching network 419.

Alternatively, in some embodiments the process chamber 400 may utilize capacitively coupled RF power provided by coupling the plasma power source 418 to an upper electrode 402 proximate an upper portion of the process chamber 400 (as shown by dashed lines 404). For example, the upper electrode 402 may be a conductor formed, at least in part, by one or more of the ceiling 420, a showerhead or other component disposed proximate the ceiling (as shown), or the like, fabricated at least in part from a suitable conductive material.

Alternatively or in combination, a remote plasma source 417 may be provided to provide species from a remotely formed plasma to the process chamber 400.

The plasma power source 418 typically is capable of producing up to 3000 W at a tunable frequency in a range from about 50 KHz to about 13.56 MHz. The plasma power source 418 may be operable in a continuous wave (CW) or pulsed mode. When in pulse mode, the plasma power source 418 may be pulsed at a pulse frequency of up to about 100 KHz, or in some embodiments, between about 100 Hz to about 100 KHz. The plasma power source 418 may be operated at a duty cycle (e.g., the percentage of on time during the total of on time and off time in a given cycle) of between about 10% and about 90%.

The substrate support 416 is coupled, through a second matching network 424, to a bias power source 422. The bias power source 422 generally is capable of producing up to 1500 W at a frequency of approximately 13.56 MHz. The bias power may be either continuous or pulsed power. In other embodiments, the bias power source 422 may be a DC or pulsed DC source. The bias power source 422 may be operable in a continuous wave (CW) or pulsed mode. When in pulse mode, the bias power source 422 may be pulsed at a pulse frequency of up to about 100 kHz, or in some embodiments, between about 100 Hz to about 100 kHz. The bias power source 422 may be operated at a duty cycle (e.g., the percentage of on time during the total of on time and off time in a given cycle) of between about 10% and about 90%.

A controller 440 comprises a central processing unit (CPU) 444, a memory 442, and support circuits 446 for the CPU 444 and facilitates control of the components of the process chamber 400 and, as such, of the etch process, as discussed herein in further detail.

In operation, a substrate 414 is placed on the substrate support 416 and process gases are supplied from a gas panel 438 through entry ports 426 and form a gaseous mixture 450. The gaseous mixture 450 is ignited into a plasma 455 in the process chamber 400 by applying power from the plasma power source 418 and bias power source 422 to the inductive coil element 412 (or the upper electrode 402) and the cathode (substrate support 416), respectively. In some embodiments, the gaseous mixture 450 is ignited into a plasma in the remote plasma source 417 coupled to the process chamber 400. The pressure within the interior of the process chamber 400 is controlled using a throttle valve 427 and a vacuum pump 436. Typically, the wall 430 is coupled to an electrical ground 434. The temperature of the wall 430 is controlled using liquid-containing conduits (not shown) that run through the wall 430.

In some embodiments, the temperature of the substrate 414 may be controlled by stabilizing a temperature of the substrate support 416. In some embodiments, an inert gas, such as helium or argon, from a gas source 448 is provided via a gas conduit 449 to channels (not shown) formed in the substrate support surface under the substrate 414. The inert gas is used to facilitate heat transfer between the substrate support 416 and the substrate 414. During processing, the substrate support 416 may be heated to a predetermined temperature by one or more resistive heaters (two resistive heaters 428, 429 shown) disposed within the substrate support and coupled to a power supply 425. The inert gas provided between the substrate support 416 and the substrate 414 facilitates more uniform heating of the substrate 414. Using such thermal control, the substrate 414 (or the substrate support or components disposed on the substrate support) may be maintained at a temperature of between about 0 to about 650 degrees Celsius.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of removing contaminants from a surface of a first layer disposed atop a substrate, comprising:
   providing a first process gas to a process chamber comprising a chlorine containing gas, a hydrogen containing gas, and an inert gas;
   forming a plasma from the first process gas;
   exposing the surface of the first layer disposed atop the substrate to the plasma, wherein the substrate is a semiconductor wafer; and
   exposing the surface of the first layer to a second process gas comprising hydrogen ($H_2$) and tert-butyl-alcohol (TBA) at a temperature of about 600 degrees Celsius to about 650 degrees Celsius.

2. The method of claim 1, further comprising:
   exposing the surface of the first layer to a process gas comprising a Group III element and a Group V element to deposit a layer atop the first layer.

3. The method of claim 1, wherein the first layer comprises one or more Group III-V materials.

4. The method of claim 1, further comprising:
forming the plasma from the first process gas using an RF power source providing about 150 watts to about 300 watts of power at a frequency of about 13.56 MHz; and
applying a bias power to the substrate while exposing the surface of the first layer to the plasma, wherein the bias power is provided from an RF power source providing about 10 watts to about 50 watts of power.

5. The method of claim 4, further comprising igniting the first process gas at a pressure of about 10 mTorr to about 30 mTorr.

6. The method of claim 4, further comprising exposing the substrate to the second process gas at a pressure of about 10 Torr to about 80 Torr.

7. The method of claim 4, further comprising exposing the substrate to the plasma for about 5 seconds to about 30 seconds and exposing the substrate to the second process gas for less than about 60 seconds.

8. A method for removing contaminants from a surface of a first layer disposed atop a semiconductor wafer disposed in a substrate processing system, comprising:

providing a first process gas comprising a chlorine containing gas, a hydrogen containing gas, and an inert gas to a process chamber having the surface disposed within the process chamber;

igniting the first process gas to form a plasma from the first process gas using an RF power source providing about 150 watts to about 300 watts of power at a frequency of about 13.56 MHz;

exposing the surface to the plasma to remove contaminants from the surface;

applying a bias power to the semiconductor wafer while exposing the surface of the first layer to the plasma, wherein the bias power is provided from an RF power source providing about 10 watts to about 50 watts of power; and exposing the semiconductor wafer to a second process gas comprising hydrogen ($H_2$) and tert-butyl-alcohol (TBA) at a temperature of about 600 degrees Celsius to about 650 degrees Celsius.

* * * * *